United States Patent
Pasotti et al.

[11] Patent Number: 6,081,448
[45] Date of Patent: Jun. 27, 2000

[54] METHOD AND DEVICE FOR ANALOG PROGRAMMING OF FLASH EEPROM MEMORY CELLS WITH AUTOVERIFY

[75] Inventors: Marco Pasotti, S. Martino Siccomario; Roberto Canegallo, Tortona; Ernestina Chioffi, Pavia; Danilo Gerna, Montagna In Valtellina; Pier Luigi Rolandi, Monleale, all of Italy

[73] Assignee: STMicroelectronics S.r.l., Agrate Brianza, Italy

[21] Appl. No.: 09/162,639

[22] Filed: Sep. 28, 1998

[30] Foreign Application Priority Data

Sep. 19, 1997 [EP] European Pat. Off. .............. 97830477

[51] Int. Cl.[7] .................................................. G11C 16/06
[52] U.S. Cl. ................... 365/185.03; 365/185.2; 365/185.21; 365/185.22
[58] Field of Search ........................... 365/185.03, 185.2, 365/185.21, 185.22

[56] References Cited

U.S. PATENT DOCUMENTS

| | | | |
|---|---|---|---|
| 5,339,272 | 8/1994 | Tedrow et al. ........................ | 365/185.2 |
| 5,422,842 | 6/1995 | Cernea et al. ........................... | 365/185 |
| 5,495,442 | 2/1996 | Cernea et al. ........................ | 365/185.03 |
| 5,532,964 | 7/1996 | Cernea et al. ........................ | 365/189.09 |
| 5,555,521 | 9/1996 | Hamada et al. ..................... | 365/185.03 |
| 5,606,522 | 2/1997 | Chai .................................... | 365/185.03 |
| 5,721,702 | 2/1998 | Briner ................................. | 365/185.21 |
| 5,889,703 | 3/1999 | Shiota et al. ......................... | 365/185.2 |

FOREIGN PATENT DOCUMENTS 03171494  7/1991  Japan .

OTHER PUBLICATIONS

Fujita, O., et al., "Characteristics Of Floating Gate Device As Analogue Memory For Neural Networks," *Electronics Letters*, vol. 27, No. 11, May 23, 1991, pp. 924–926.

*Primary Examiner*—Huan Hoang
*Attorney, Agent, or Firm*—Theodore E. Galanthay; Robert Iannucci; Seed IP Law Group PLLC

[57] ABSTRACT

A device for analog programming is disclosed. The device comprises a current mirror circuit connected to drain terminals of a cell to be programmed and of a MOS reference transistor. An operational amplifier has inputs connected to the drain terminals of the cell and respectively of the MOS transistor and an output connected to the control terminal of the MOS transistor. During programming, the control and drain terminals of the cell are biased at corresponding programming voltages and the output voltage of the operational amplifier, which is correlated to the current threshold voltage level of the cell, is monitored and the programming is interrupted when this output voltage becomes at least equal to a reference voltage correlated to the threshold value desired for the cell.

26 Claims, 2 Drawing Sheets

METHOD AND DEVICE FOR ANALOG PROGRAMMING OF FLASH EEPROM MEMORY CELLS WITH AUTOVERIFY

TECHNICAL FIELD

The present invention relates to a method and a device for analog programming of flash EEPROM memory cells with autoverify.

BACKGROUND OF THE INVENTION

As is known and shown by way of example in FIG. 1, a flash memory array 1 comprises a plurality of flash cells 2 disposed on lines and columns, in which the gate terminals of the cells 2 disposed on one and the same line are connected to a respective word line 3, the drain terminals of the cells 2 disposed on one and the same column are connected to a respective bit line 4 and the source terminals are generally connected to ground. The word lines 3 are connected to a row decoder 5 and the bit lines 4 are connected to a column decoder 6 which receive respective address and control signals from a control unit 7 which permits the selection, from time to time, of a single word line 3 and a single bit line 4 and the biasing of the cell 2 connected to the word line and to the bit line selected at the operating voltages provided.

In particular, a cell 2 may be read by connecting the selected word line 3 to an external voltage $V_G$ of preset value (such as 8–9 V) and forcing a biasing current $I_f$ into the selected bit line 4. Keeping the selected cell in linear region, the following equation applies:

$$I_f = K^*(W/L)^*[(V_G - V_{th}) - V_{DS}/2]^* V_{DS} \quad (1)$$

in which K is a constant associated with the production process. W/L is the dimensional width/length ratio of the cell, $V_{th}$ is the threshold voltage of the cell (or the minimum voltage to be applied between the gate and source terminals of the cell so that it begins to conduct current) and $V_{DS}$ is the drain/source voltage drop of the cell. In (1) the term $K^*(W/L)^*V_{DS} = GM_f$ represents the transconductance (gain) of the cell and the term $(V_G - V_{th})$ represents the overdrive of the cell.

By suitably biasing the cell, the drop $V_{DS}$ is constant and the term $V_{DS}/2$ is negligible with respect to the overdrive $(V_G - V_{th})$; consequently, in this state the current $I_f$ flowing through the cell depends linearly on the threshold voltage, $V_{th}$.

During writing (programming) of the cell, the latter is selected by biasing the selected word and bit lines at respective preset programming voltage values. Writing takes place due to the phenomenon of hot electron injection, whereby a high voltage supplied to the drain terminal of the cell to be written causes an increase in the velocity of the electrons and some of them achieve sufficient energy to overcome the barrier of a tunnel oxide. By forcing on the gate terminal a voltage which is higher than on the drain terminal, the electric field thus created accelerates the electrons through the layer of oxide which separates the channel region from the floating gate region and permits the trapping of those electrons inside the floating gate region. The memory cell modifies its threshold voltage because of this trapping of the electrons.

By its nature, the phenomenon of hot electron injection is not controlled and not repeatable with accuracy; consequently, at the present time, during programming, the cell is read several times for determining the threshold voltage reached (verify phase).

This procedure is far from optimal, however, in view of the long periods of time required because of the need to interrupt programming, measure the threshold level reached and supply a new programming pulse. To overcome these problems for EEPROM memory cells, a system of programming and simultaneous verification of the programming has already been proposed (see U.S. Pat. No. 5,422,842: U.S. Pat. No. 5,495,442 and U.S. Pat. No. 5,532,964 for example) which consists of measuring the current flowing through the cell during programming and comparing it with a reference current; as soon as the measured current becomes equal to or lower than the reference current, programming is interrupted.

SUMMARY OF THE INVENTION

An object of the invention is therefore to provide a method and a device which permits the verification of the threshold reached by flash-EEPROM cells during programming.

Embodiments of the present invention provide a method for analog programming of flash EEPROM memory cells with autoverify, including connecting a current source with two outputs to a first terminal of said cell and to a first terminal of a MOS transistor; and supplying a first voltage to a control terminal of a memory cell. The method also includes connecting the first terminal of the memory cell and the first terminal of the MOS transistor to a second voltage and connecting a second terminal of the memory cell and a second terminal of the MOS transistor to a reference potential, whereby the first and second voltages are selected to program the memory cell. Next, the first terminals of the memory cell and of the MOS transistor are coupled to a first and a second input of a negative feedback element and an output of the negative feedback element is coupled to a control terminal of the MOS transistor. The output voltage of the negative feedback element is monitored while the first terminal of the memory cell is connected to the second voltage and the output voltage is compared with a reference voltage. When the output voltage becomes at least equal to said reference voltage, the supply of the second voltage to said first terminal of said cell is interrupted.

Embodiments of the invention also include a device for analog programming of a flash EEPROM memory cell, connected to a memory cell having a first and a second terminal and a control terminal, comprising a MOS transistor having a first and a second terminal and a control terminal and first and second current generating means generating a first and, respectively, a second current correlated to each other, the first current generating means being connected to the first terminal of the cell and the second current generating means being connected to the first terminal of the MOS transistor. The device also includes a negative feedback means having a first and a second input connected to the first terminal of the cell and, respectively, the first terminal of the MOS transistor and an output connected to the control terminal of the MOS transistor.

BRIEF DESCRIPTION OF THE DRAWINGS

For an understanding of the invention, preferred embodiments will now be described, purely by way of non-exhaustive example, with reference to the accompanying drawings.

DETAILED DESCRIPTION OF THE INVENTION

Figure 1:
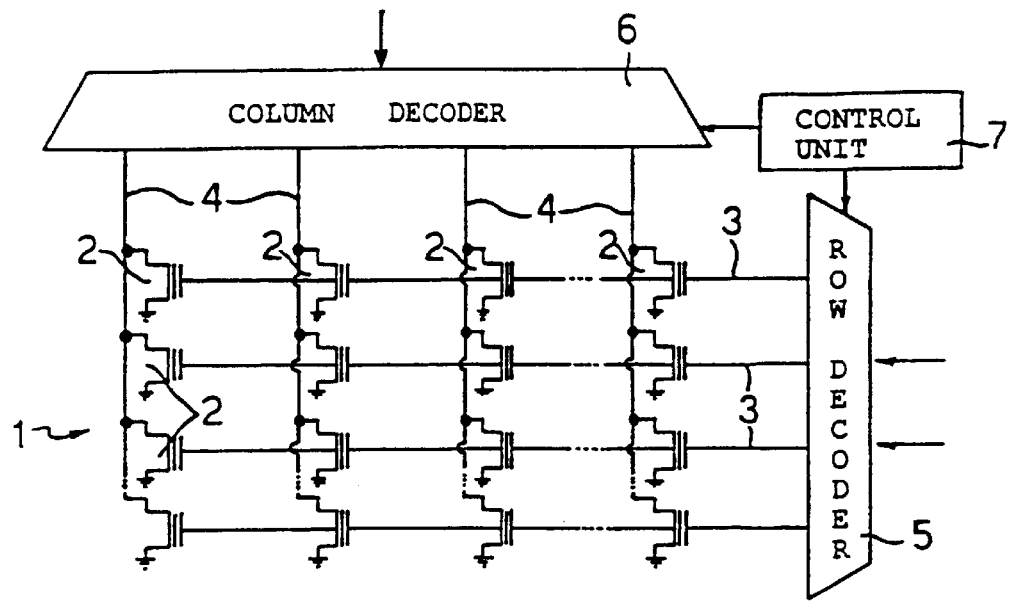
FIG. 1 shows a simplified circuit diagram of a flash memory of A known type.
Figure 2:
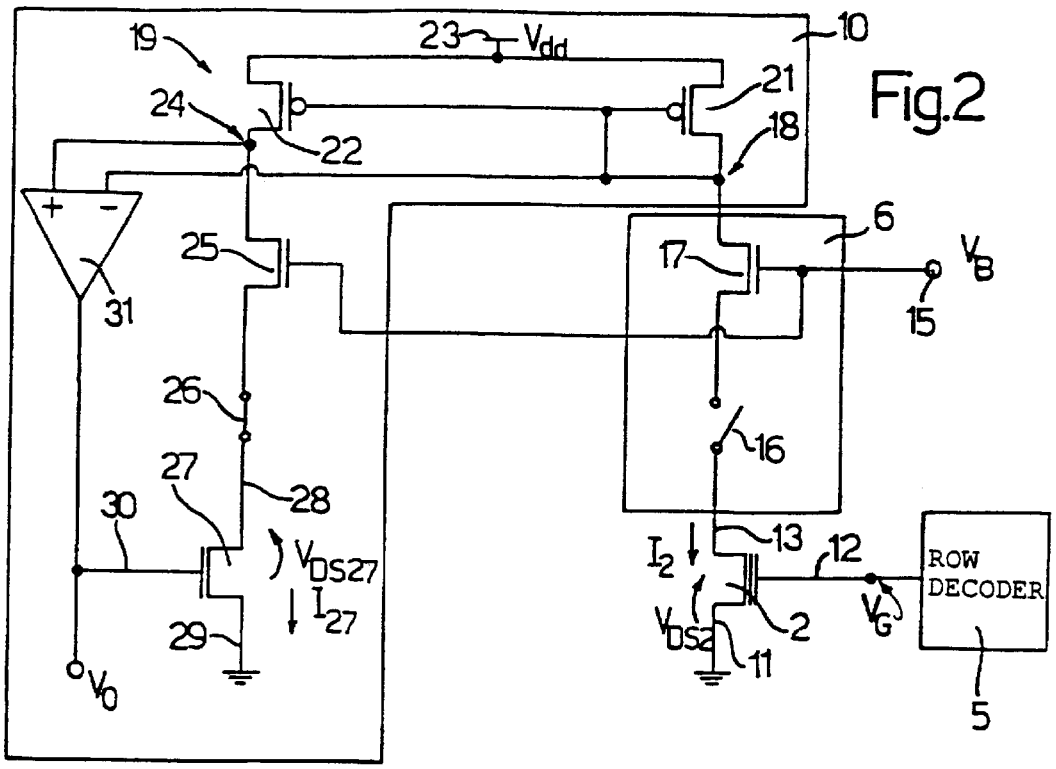
FIG. 2 shows a simplified circuit diagram of the present programming and verify device.

FIG. 2 shows the programming and verify device 10 as connected to a cell to be read 2 belonging to the memory array 1 shown in FIG. 1. For reasons of simplicity, FIG. 2 shows only the cell to be read 2 addressed via the row decoder 5 and the column decoder 6; the row decoder 5 has been omitted and only the essential elements of the column decoder 6 have been shown.

In particular, as shown in FIG. 2, the cell to be read 2 has source terminal 11 connected to ground, gate terminal 12 biased at the programming voltage $V_G$ and drain terminal 13 connected to a node 18 via a selector switch 16 and a first biasing transistor 17 of NMOS type, both belonging to the column decoder 6 of FIG. 1. The node 18 is connected to a current mirror device 19 formed by two PMOS transistors 21, 22, in detail, the PMOS transistor 21 is diode-connected (i.e., it has short-circuited drain and gate terminals) and has a drain terminal connected to the node 18, a source terminal connected to a supply line 23 set at $V_{dd}$ and a gate terminal connected to a gate terminal of the PMOS transistor 22; this latter has a source terminal connected to the supply line 23 and a drain terminal connected to a node 24.

Via a second biasing transistor 25 also of NMOS type and a dummy switch 26 kept closed at all times, the node 24 is connected to the drain terminal 28 of a reference transistor 27, of NMOS type, having source terminal 29 connected to ground and gate terminal 30 connected to the output of an operational amplifier 31. This latter has an inverting input connected to the node 18 and a non-inverting input connected to the node 24. The second biasing transistor 25 has a gate terminal connected to the gate terminal of the first biasing transistor 17 and to a biasing node 15 to which a biasing voltage $V_B$ is supplied. The biasing transistors 17 and 25 have the function of biasing the cell 2 and the reference transistor 27 at the desired voltage on the basis of the operating condition provided.

FIG. 2 also shows the output voltage $V_o$ of the operational amplifier 31, also forming the output voltage of the programming and verify device 10. FIG. 2 also indicates the voltage drop $V_{DS2}$ and $V_{DS27}$ between the drain and source terminals of the cell to be read 2 and, respectively, the reference transistor 27; as well as the currents $I_2$ and $I_{27}$ flowing through the cells.

European patent application No. 97830172.9 entitled "High-precision analog reading circuit for memory arrays, in particular analog flash memory arrays" filed on Apr. 15, 1997 in the name of the same applicant, incorporated here by reference, describes a read device structurally similar to that of FIG. 2, in which a flash cell similar to the cell 2 is provided in place of reference transistor 27. For this device to which European application No. 97830172.9 relates, it has been shown, as briefly reported below, that the output voltage $V_o$ of the operational amplifier 31 is linearly dependent on the threshold voltage $V_{th2}$ of the cell 2. In fact, on the basis of equation (1), the current $I_2$ flowing through the cell to be read 2 and the current $I_R$ flowing through the reference cell are expressed by:

$$I_2 = K^*(W/L)^*[(V_G - V_{th2}) - V_{DS2}/2]^* V_{DS2} \quad (2)$$

$$I_R = K^*(W/L)^*[(V_o - V_{thR}) - V_{DSR}/2]^* V_{DSR} \quad (3)$$

in which $V_{th2}$ and $V_{thR}$ are the threshold voltages of the cell to be read 2 and of the reference cell respectively, $V_{DSR}$ is the source/drain drop of the reference cell and the other variables have the meaning already explained.

In the read condition, by assuming that the PMOS transistors 21 and 22 belonging to the current mirror device 19 and the biasing transistors 17 and 25 work at saturation, we have:

$$I_2 = I_R \quad (4)$$

Furthermore, in the equilibrium condition, the voltages at the inputs of the operational amplifier 31 (voltages at the nodes 18 and 24) are equal and, given that the biasing transistors 17, 25 receive, at the gate terminal, a same biasing voltage $V_B$ (of 1.2–1.4 V for example), they have the same gate-to-source drop; it follows that if the voltage drops at the terminals of the selector switch 16 and the dummy switch 26 are equal, we have:

$$V_{DS2} = V_{DSR} \quad (5)$$

From (2) and (3), and taking account of (4) and (5), we obtain:

$$V_G - V_{th2} = V_o - V_{thR} \quad (6)$$

From (7) we also immediately obtain:

$$V_o = V_G - (V_{th2} - V_{thR}) \quad (7)$$

From (7) we see that the output voltage $V_o$ of the amplifier 31 is linearly dependent on the threshold voltage $V_{th2}$ of the cell to be read 2, so that the reading of this output voltage $V_o$ supplies the threshold value $V_{th2}$, knowing the threshold voltage of the reference cell R and the read voltage $V_G$ applied to the gate terminal 12 of the cell to be read 2.

In the case of the device of FIG. 2, during reading, (7) is still valid, given that (1) also applies to the reference transistor 27 and assuming equal values for the parameters K, W and L.

Figure 4:
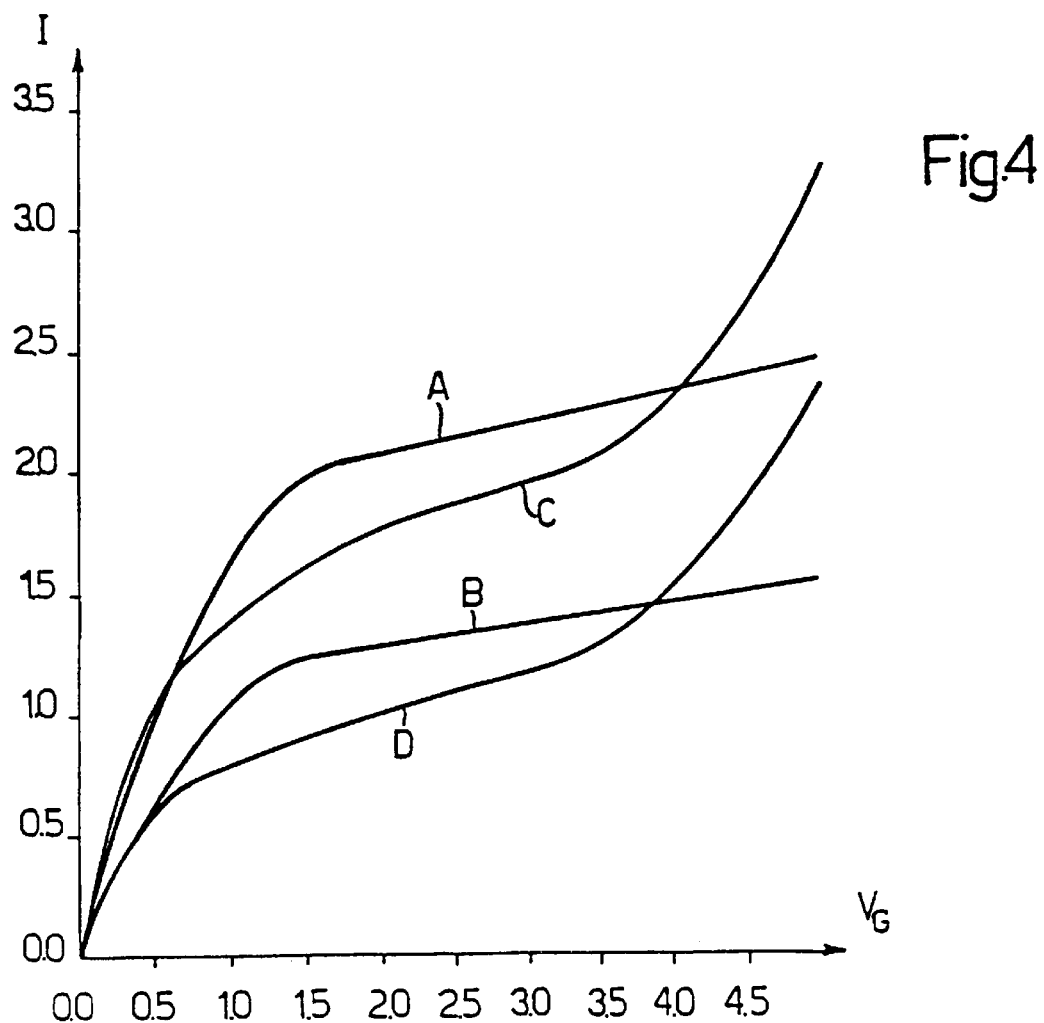
FIG. 4 shows the plot of significant electrical variables of the present device.

At the start of programming, a high Voltage $V_B$ is supplied to the gate terminal of the biasing transistors 17, 25 so as to bring the drain terminal 13 of the cell to be programmed 2 to the programming drain voltage (7–8 V for example); a high voltage $V_G$ (12 V for example) is also applied to the gate terminal 12 of the cell 2. In this condition, hot electrons are injected into the floating gate region of the cell 2 which thus gradually modifies its threshold voltage. In this phase, the currents $I_2$ and $I_{27}$ are no longer equal but are nonetheless correlated and the output voltage $V_o$ is still linearly dependent on the instantaneous threshold voltage of the cell 2. As the programming of the cell 2 continues and its threshold voltage increases, the current $I_2$ flowing in the cell 2 decreases, the voltage at the node 18 increases, the output voltage $V_o$ and hence the voltage at the gate terminal of the reference transistor 27 decreases and its current $I_{27}$ decreases. In particular, the reduction of the current $I_{27}$ is substantially equal to the decrease of the current $I_2$ flowing in the cell 2, as can also be seen from FIG. 4 showing the plot of the currents $I_2$ and $I_{27}$ for the cell 2 and the transistor 27 versus the gate voltage $V_G$ for two different threshold voltage values corresponding to two different moments of programming. In particular, the curves A and B refer to current $I_2$ of cells 2 having threshold voltages $V_{th'}$ and $V_{th''}$, where $V_{th'} < V_{th''}$ and the curves C and D refer to the plots of current $I_{27}$ in the conditions of the curves A and B. In practice, during programming, the current characteristics of the cell 2 and of the reference transistor 27 move contemporaneously downwards because of the increase of the threshold voltage of the cell 2 and of the corresponding reduction of the gate voltage of the reference transistor 27.

In this way, by reading the output voltage $V_o$ of the device 10, it is possible to monitor the programming phase instant by instant and interrupt it when the cell 2 has reached the desired threshold value.

Figure 3:
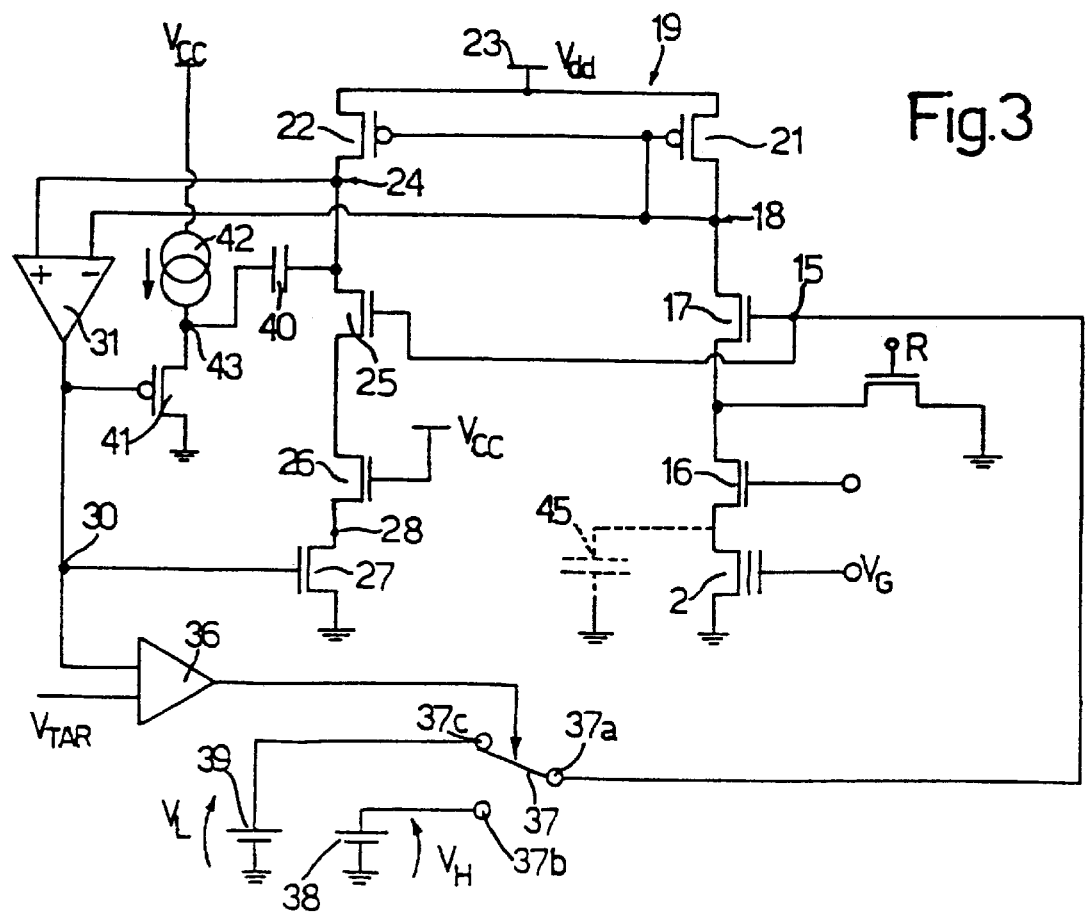
FIG. 3 shows a more detailed circuit diagram of the present device.

FIG. 3 shows a more complete embodiment of the device 10, equipped with means for automatically interrupting the programming when the desired threshold voltage is reached, and with means of compensation of the loop formed by the components 31, 27, 26, 25 and 22.

In addition to the elements of FIG. 2, FIG. 3 shows a comparator 36, having a first input connected to the output of the operational amplifier 31 and a second input receiving a reference voltage $V_{TAR}$ representing the target voltage, correlated to the threshold voltage desired for the cell 2. The output of the comparator 36 is connected to a selection input 37a of a switch 37 selectively connecting one of two nodes 37b or 37c to the biasing node 15. The node 37b is connected to a first voltage source 38 supplying the programming biasing voltage $V_H$ and the node 37c is connected to a second voltage source 39 supplying the read biasing voltage $V_L$ of lower value.

FIG. 3 further shows a compensation capacitor 40, a compensation transistor 41 and a current source 42. In detail, the compensation capacitor 40 is connected between the node 24 and a node 43; the current source 42 is arranged between the supply line 23 and the node 43 and the compensation transistor 41, of PMOS type, has its source terminal connected to the node 43, its gate terminal connected to the output of the operational amplifier 31 and its drain terminal connected to ground. These elements thus compensate for the loop 31, 27, 26, 25 which constitutes a two-stage amplifier, the first stage of which is formed by the operational amplifier 31 and the second stage uses the reference transistor 27 as amplifier element and in which the biasing transistor 25 operates as a cascode element which supplies a high impedance to the output of the loop (node 24).

Finally, FIG. 3 shows a capacitor 45, shows by broken lines and representing the parasitic capacitance of the bit line to which the cell to be read 2 is connected; the transistors (of NMOS type) which form the switches 16 and 26 and a reset transistor 44, of NMOS type, having the drain terminal connected to the intermediate node between the transistors 16 and 17, the source terminal connected to ground and the gate terminal receiving a control signal R.

In the device of FIG. 3, at the start of the programming phase, when the gate programming voltage $V_G$ is supplied to the gate terminal 12 of the cell 2, the cell has low threshold voltage, the output $V_o$ of the operational amplifier 31 is greater than the target voltage $V_{TAR}$ (which, on the basis of (7), is equal to the programming gate voltage value $V_G$ minus the desired threshold value and minus the threshold voltage value of the reference transistor 27) and the comparator 36 keeps the switch 37 in the position connecting the node 37b to the node 15. The node 15 is thus supplied by the high voltage $V_H$ and the cell 2 begins to be programmed.

When, on increase of the threshold of the cell 2, the voltage $V_o$ reaches the target value $V_{TAR}$, the comparator switches, bringing the switch into the position connecting the node 37c to the node 15. The node 15 is thus supplied at low voltage $V_L$ and programming of the cell 2 is interrupted.

The above-mentioned system operates with high accuracy for medium-low values of the drain-to-source voltage $V_{DS}$ in which the characteristic of the flash cell and of the MOS transistor change in the same way with respect to the drain-to-source voltage. For high values of this voltage, the existing structural differences (so-called "short channel" effect of the flash cell on the basis of which the drain current of the cell increases much more quickly than that of the MOS transistor, which flattens out, as can also be seen from the graphs of FIG. 4) are such as to reduce the accuracy provided by this device. To solve this problem, it is possible to use the simultaneous autoverify procedure solely in the first part of the programming phase in which high accuracy is not necessary. Subsequently, as the desired threshold value is approached, it is advisable to use the traditional programming system, sending programming pulses and then verifying, by means of a flash reference cell equal to the memory cell to be programmed, that the desired threshold has been reached, as described in the above-mentioned European patent application. In this case, with respect to the diagram of FIG. 3, a further comparator may be provided which is similar to the comparator 36 and receives a reference voltage correlated to a value which is lower than $V_{TAR}$; this comparator may control a further switch which may switch off the reference transistor 27 (by acting on the dummy transistor 26, for example, which would operate like a selection transistor for this purpose) and switch on a reference cell equal to the cell 2 downstream of the biasing transistor 25.

The advantages of the described method and device include the following. Firstly, they permit an extremely quick method of programming, including in the case of use solely in the first part of the programming, due to at least partial elimination of the dead times for interrupting programming, reading the threshold reached voltage and deciding as to whether to continue programming or not. Furthermore, the device is simple, occupies a small space in the memory and is reliable.

Finally it will be clear that numerous modifications and variants may be introduced to the method and the device described and illustrated herein all of which come within the scope of the inventive concept as defined in the accompanying claims.

We claim:

1. A method for analog programming of a flash EEPROM memory cell, comprising the steps of:

connecting a current source with two outputs to a first terminal of said cell and to a first terminal of a MOS transistor;

supplying a first voltage to a control terminal of said cell, connecting said first terminal of said cell and said first terminal of said MOS transistor to a second voltage and connecting a second terminal of said cell and second terminal of said MOS transistor to a reference potential, said first and second voltage being of amplitude such as to program said cell;

connecting said first terminals of said cell and of said MOS transistor to a first and a second input of a negative feedback element and connecting an output of said negative feedback element to a control terminal of said MOS transistor;

monitoring the output voltage of said negative feedback element while said first terminal of said cell is connected to said second voltage and comparing said output voltage with a reference voltage; and interrupting the supply of said second voltage to said first terminal of said cell when said output voltage becomes at least equal to said reference voltage.

2. The method according to claim 1 wherein said output voltage is proportional to a current threshold voltage level of said cell and wherein said reference voltage is proportional to a desired threshold voltage level desired of said cell.

3. The method according to claim 1 wherein said negative feedback element is an operational amplifier.

4. A device for analog programming of a flash EEPROM memory cell having a first and a second terminal and a control terminal, the device comprising:

a non-floating gate MOS transistor having a first and a second terminal and a control terminal and not having a floating gate;

first and second current generating means generating a first and, respectively, a second current correlated to each other, said first current generating means being connected to said first terminal of said cell and said second current generating means being connected to said first terminal of said MOS transistor; and negative feedback means having a first and a second input connected to said first terminal of said cell and, respectively, said first terminal of said MOS transistor and an output connected to said control terminal of said MOS transistor.

5. The device according to claim 4 wherein said negative feedback means comprise an operational amplifier having an inverting input connected to said first terminal of said cell and a non-inverting input connected to said first terminal of said MOS transistor.

6. The device according to claim 4 wherein said first terminal of said cell and of said MOS transistor is a drain terminal, said second terminal of said cell and of said MOS transistor is a source terminal and said control terminal of said ell and of said MOS transistor is a gate terminal.

7. The device according to claim 4 wherein said first and second current generating means form a current mirror circuit.

8. The device according to claim 7 wherein the first current generating means include a diode-connected first mirror transistor having first and second conduction terminals and a control terminal, the second conduction terminal being coupled to the control terminal and to the first terminal of the cell; and the second current generating means include a second mirror transistor having first and second conduction terminals and a control terminal, the first conduction terminals of the first and second mirror transistors being connected to each other, the control terminals of the first and second mirror transistors being connected to each other, and the second conduction terminal of the second mirror transistor being coupled to the MOS transistor.

9. A device for analog programming of a flash EEPROM memory cell, connected to a memory cell having a first and a second terminal and a control terminal, comprising:

a MOS transistor having a first and a second terminal and a control terminal;

first and second current generating means generating a first and, respectively, a second current correlated to each other, said first current generating means being connected to said first terminal of said cell and said second current generating means being connected to said first terminal of said MOS transistor;

negative feedback means having a first and a second input connected to said first terminal of said cell and, respectively, said first terminal of said MOS transistor and an output connected to said control terminal of said MOS transistor; and a first and a second biasing transistor interposed between said first current generating means and said first terminal of said cell and, respectively, between said second current generating means and said first terminal of said MOS transistor, said first and second biasing transistors having respective control terminals connected to each other and receiving a common biasing signal.

10. The device according to claim 9, further comprising a comparator element having a first and a second input and an output; said first input of said comparator element being connected to said output of said negative feedback element; said second input of said comparator element receiving a reference voltage and said output of said comparator element being connected to a control terminal of a two-position switch connected to a first and a second biasing voltage and to said control terminals of said first and second biasing transistor; said switch, in a first commutation position, connecting said first input to said control terminals of said biasing transistors and, in a second commutation position, connecting said second input to said control terminals of said biasing transistors.

11. A device for analog programming of a flash EEPROM memory cell, connected to a memory cell having a first and a second terminal and a control terminal, comprising:

a MOS transistor having a first and a second terminal and a control terminal;

first and second current generating means generating a first and, respectively, a second current correlated to each other, said first current generating means being connected to said first terminal of said cell and said second current generating means being connected to said first terminal of said MOS transistor;

negative feedback means having a first and a second input connected to said first terminal of said cell and, respectively, said first terminal of said MOS transistor and an output connected to said control terminal of said MOS transistor; and a compensation circuit interposed between said first terminal of said MOS transistor and said output of said negative feedback means.

12. The device according to claim 11 wherein said compensation circuit comprises a compensation capacitor and a compensation transistor, said compensation capacitor having a first terminal connected to said first terminal of said MOS transistor and a second terminal connected to a first terminal of said compensation transistor, said compensation transistor having a control terminal connected to said output of said negative feedback means.

13. A method for programming an EEPROM memory cell comprising:

coupling a current source to a first terminal of the memory cell and to a first terminal of an MOS transistor;

coupling a control terminal of the memory cell to a first voltage;

coupling the first terminals of the memory cell and the MOS transistor to a second voltage, wherein the first and second voltages are at a sufficient level to program the memory cell;

coupling a reference voltage to a second terminal of the memory cell and a second terminal of the MOS transistor;

coupling the first terminals of the memory cell and the MOS transistor to a negative feedback circuit having an output coupled to a control terminal of the MOS transistor;

comparing the output of the negative feedback circuit with a second reference voltage; and decoupling the second voltage from the first terminal of the memory cell when the output of the negative feedback circuit equals the second reference voltage.

14. The method of claim 13 wherein the output of the negative feedback circuit is proportional to a present threshold voltage of the memory cell, and wherein the second reference voltage is proportional to a target threshold value of the memory cell.

15. The method of claim 13 wherein the negative feedback circuit comprises an operational amplifier.

16. A programming circuit for an EEPROM memory cell comprising:

a non-floating gate MOS transistor that does not have a floating gate;

a first and a second current generating circuit coupled respectively to a first terminal of the MOS transistor and a first terminal of the memory cell; and a feedback circuit having first and second inputs respectively coupled to the first terminal of the memory cell and the first terminal of the MOS transistor and having an output coupled to a control terminal of the MOS transistor.

17. The circuit of claim 16 wherein the feedback circuit comprises:

an operational amplifier having an inverting input coupled to the first terminal of the memory cell, a non-inverting input coupled to the first terminal of the MOS transistor, and an output coupled to the control terminal of the MOS transistor.

18. The circuit of claim 16 further comprising:

a first biasing transistor coupled between the first current generating circuit and the first terminal of the MOS transistor;

a second biasing transistor coupled between the second current generating circuit and the first terminal of the memory cell; and a bias terminal coupled to a control terminal of both the MOS transistor and the memory cell transistor, the bias terminal structured to receive a bias signal.

19. The circuit of claim 16 wherein the current generating circuits are arranged as a current mirror.

20. The device according to claim 19 wherein the first current generating circuit includes a diode-connected first mirror transistor having first and second conduction terminals and a control terminal, the second conduction terminal being coupled to the control terminal and to the first terminal of the cell; and the second current generating circuit includes a second mirror transistor having first and second conduction terminals and a control terminal, the first conduction terminals of the first and second mirror transistors being connected to each other, the control terminals of the first and second mirror transistors being connected to each other, and the second conduction terminal of the second mirror transistor being coupled to the MOS transistor.

21. A programming circuit for an EEPROM memory cell comprising:

a MOS transistor;

a first and a second current generating circuit coupled respectively to a first terminal of the MOS transistor and a first terminal of the memory cell;

a feedback circuit having first and second inputs respectively coupled to the first terminal of the memory cell and the first terminal of the MOS transistor and having an output coupled to a control terminal of the MOS transistor;

a first and a second biasing transistor;

a switch structured to alternatively couple a first biasing voltage and a second biasing voltage to a control terminal of the first biasing transistor and a control terminal of the second biasing transistor responsive to a switch signal received at a switch terminal; and a comparator having a first input coupled to the output of the feedback circuit, a second input coupled to a reference voltage, and an output coupled to the switch terminal, the comparator generating the switch signal.

22. A programming circuit for an EEPROM memory cell comprising:

a MOS transistor;

a first and a second current generating circuit coupled respectively to a first terminal of the MOS transistor and a first terminal of the memory cell;

a feedback circuit having first and second inputs respectively coupled to the first terminal of the memory cell and the first terminal of the MOS transistor and having an output coupled to a control terminal of the MOS transistor; and a compensation circuit coupled between the first terminal of the MOS transistor and the output of the feedback circuit.

23. The circuit of claim 22 wherein the compensation circuit comprises:

a compensation transistor having a control terminal coupled to the output of the feedback circuit; and a compensation capacitor having a first terminal coupled to the first terminal of the MOS transistor and having a second terminal coupled to a first terminal of the compensation transistor.

24. A device for analog programming of a flash EEPROM memory cell having first and second terminals and a control terminal, the control terminal being supplied with a first voltage, the device comprising:

a MOS transistor having first and second terminals and a control terminal;

a current source with a first output coupled to the first terminal of the memory cell and a second output coupled to the first terminal of the MOS transistor;

a voltage circuit that supplies a second voltage to the first terminal of the memory cell and the first terminal of the MOS transistor, the first and second voltage being of amplitude such as to program the memory cell;

a negative feedback element having first and second inputs and an output, the first and second inputs being coupled to the first terminals of the MOS transistor and memory cell, respectively, and the output being connected to the control terminal of the MOS transistor; and a comparator circuit that compares an output voltage at the output of the negative feedback element with a reference voltage and interrupts the supply of the second voltage to the first terminal of the memory cell when the output voltage becomes at least equal to the reference voltage.

25. The device according to claim 24 wherein said output voltage is proportional to a current threshold voltage level of the cell and wherein the reference voltage is proportional to a desired threshold voltage level desired of the memory cell.

26. The device according to claim 24 wherein said negative feedback element is an operational amplifier.

* * * * *

UNITED STATES PATENT AND TRADEMARK OFFICE
CERTIFICATE OF CORRECTION

PATENT NO     : 6,081,448
DATED         : June 27, 2000
INVENTOR(S)   : Marco Pasotti et al.

It is certified that error appears in the above-identified patent and that said Letters Patent are hereby corrected as shown below:

On the front cover of the issued patent, section [30], the foreign priority application date should read --Sept. 29, 1997--.

Signed and Sealed this

Twenty-fourth Day of April, 2001

*Attest:*

NICHOLAS P. GODICI

*Attesting Officer*     Acting Director of the United States Patent and Trademark Office